United States Patent [19]

Schramm

[11] 4,191,440

[45] Mar. 4, 1980

[54] ELECTRICAL CONNECTOR FOR COUPLING POWER LEADS TO CIRCUIT BOARDS

[75] Inventor: Eugene C. Schramm, Denville, N.J.

[73] Assignee: Bell Telephone Laboratories, Incorporated, Murray Hill, N.J.

[21] Appl. No.: 943,733

[22] Filed: Sep. 19, 1978

[51] Int. Cl.[2] .......................... H01R 9/18; H05K 1/12

[52] U.S. Cl. ................................ 339/17 C; 339/263 R

[58] Field of Search .............. 339/17 R, 17 C, 17 CF, 339/17 LC, 252 P, 263 R, 221 R, 221 M

[56] References Cited

U.S. PATENT DOCUMENTS

| | | | |
|---|---|---|---|
| 3,211,874 | 10/1965 | Bengtsson | 200/166 |
| 3,409,857 | 11/1968 | O'Neill et al. | 339/17 CF |
| 3,545,080 | 12/1970 | Evans | 339/17 CF |
| 3,732,529 | 5/1973 | Weisenburger | 339/17 CF |
| 3,764,955 | 10/1973 | Ward | 339/65 |
| 4,076,356 | 2/1978 | Tamburro | 339/17 C |

OTHER PUBLICATIONS

Bell Telephone Labs., "Terminal" Drawing No. 840851786, 10-2-1972.

*Primary Examiner*—Neil Abrams
*Attorney, Agent, or Firm*—John W. Fisher

[57] ABSTRACT

An electrical connector (100) for terminating heavy power leads on circuit boards includes a generally flat unitary member (101) of electrically conductive material. Near a midregion (105) of the flat member (101) there is a threaded aperture (106) for terminating one or more power leads. Interconnection between the flat member (101) and the circuit board is accomplished by a plurality of pin contacts (110) each of which has a compliant portion (112) for effecting frictional engagement with the board. The connector further includes at least one projecting studlike member (121) for counteracting shear stresses between the flat member (101) and the circuit board.

11 Claims, 3 Drawing Figures

FIG. 1
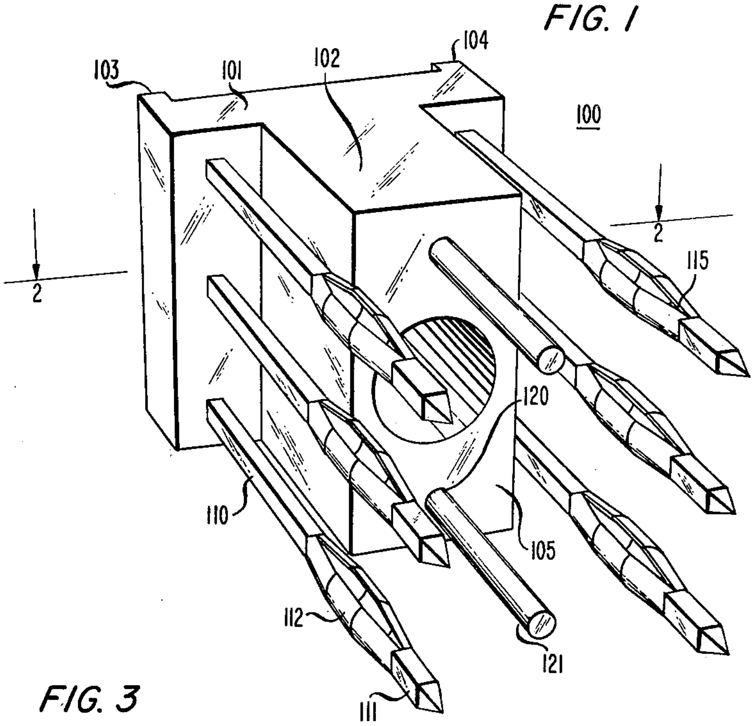
FIG. 3
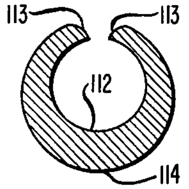
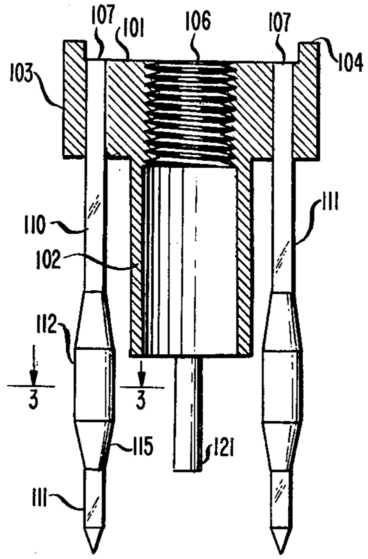
FIG. 2

ELECTRICAL CONNECTOR FOR COUPLING POWER LEADS TO CIRCUIT BOARDS

BACKGROUND OF THE INVENTION

1. Technical Field of the Invention

This invention relates to electrical connectors and, in particular, to electrical connectors for coupling power leads to circuit boards.

2. Description of the Prior Art

In many printed circuit board applications, it is oftentimes necessary to couple heavy power leads directly to the board. The power handling capability of these leads of necessity requires them to be of a somewhat heavier gauge than those leads used for normal signal interconnections. Consequently, connectors used for signal interconnections are not suitable for power connections.

One form of an interconnection pin for multilayer printed circuit boards is disclosed in P. J. Tamburro U.S. Pat. No. 4,076,356 issued Feb. 28, 1978. This pin includes a pair of elongated electrical terminals with a compliant section between the two terminals. A plurality of generally parallel raised pressure ridges are included on an outer surface of the compliant section. These pressure ridges materially aid in preventing any rotational motion being applied to the pin as wirewrap terminations are effected. This connector further includes one or more notches in the compliant section to facilitate interconnection of an axially aligned stack of printed circuit boards. While this interconnection pin is suitable for effecting many signal interconnections, it is not readily adaptable for coupling heavy gauge power leads to a printed circuit board.

Another connector arrangement is disclosed in J. A. Ward U.S. Pat. No. 3,764,955 issued Oct. 9, 1973. This connector arrangement facilitates mounting of a first circuit board or substrate in either a perpendicular or parallel relationship with a second circuit board or substrate in a motherboard-daughterboard fashion. The apparatus is comprised of an elongated mounting bar having connecting devices mounted thereon at spaced intervals. The connecting devices have aligned spring receptacles for receiving and supporting the first circuit board and have posts for entering holes in the second printed circuit board. Although this apparatus is undoubtedly suitable for its intended purpose, it is not readily usable for coupling heavy gauge power leads to a printed circuit board.

In B. S. Bengtsson U.S. Pat. No. 3,211,874 issued Oct. 12, 1965 there is disclosed contact supporting brackets and contacts for relays. One feature of the disclosed construction is the formation of various parts to include within the parts themselves fastening means by which the parts may be assembled. The disclosed apparatus, however, is wholly unsuitable for the connection of heavy gauge power leads to printed circuit boards.

SUMMARY OF THE INVENTION

To overcome the problems associated with the prior art devices, I have developed an electrical connector which is comprised of a generally flat unitary member of electrically conductive material. This member has at least one aperture therein for terminating at least one electrical conductor. Affixed to the flat member are means for electrically and mechanically coupling the member to a circuit board. Each of the coupling means includes a compliant portion at an intermediate point along its length and a terminal portion for providing a flexible connection to the flat member. Also affixed to the flat member are means for counteracting shear stresses between the member and the circuit board.

Numerous advantages result from this connector design. For example, the utilization of a compliant portion at an intermediate point along the length of the coupling devices enables my connector to effect frictional engagement with the circuit board. This results in a greatly simplified electrical and mechanical connection between the connector and the board. In addition, the use of a pair of studlike projections absorb any shear stresses which might be produced during connector use. A further advantage derives from the use of a pair of raised lips along oppositely disposed outer edges of the flat member to ensure proper alignment between the terminated power lead and the connector.

BRIEF DESCRIPTION OF THE DRAWINGS

The aforementioned advantages of the invention as well as other advantages would be better understood upon consideration of the following detailed description and the appended claims taken in conjunction with the attached drawings of an illustrative embodiment in which:

FIG. 1 is a perspective view of the connector;

FIG. 2 is a cross-sectional view taken along section lines 2—2 of FIG. 1 illustrating the construction of the flat conductive member; and FIG. 3 is a cross-sectional view taken along section lines 3—3 of FIG. 2 illustrating the nonuniform cross section of the compliant portion of the coupling means.

DETAILED DESCRIPTION

An electrical connector 100 for coupling power leads to a circuit board (not shown) is illustrated in FIGS. 1 and 2. Connector 100 is comprised of a generally flat unitary member 101 of electrically conductive material which has integral therewith projection 102. Along oppositely disposed top edges of flat member 101 are raised lips 103 and 104. The spacing between raised lips 103 and 104 is approximately equal to the width of a connector (not shown) which terminates a power lead (not shown). Raised lips 103 and 104 facilitate alignment between the terminated power lead and connector 100.

At an intermediate region 105 of flat member 101, at a point approximately between raised lips 103 and 104, there is a threaded aperture 106. Threaded aperture 106 is adapted to mate with a threaded fastener (not shown) for securely fastening the power lead terminal to connector 100. Depending upon the particular application, additional threaded apertures 106 can be advantageously included so that a plurality of power leads can be terminated on a single connector 100.

Along an edge of flat member 101 there are a plurality of apertures 107 for engaging a plurality of pin contacts 110. Pin contacts 110 are used to effect frictional engagement of connector 100 with the circuit board thereby achieving both electrical and mechanical coupling of connector 100 to the board.

Each of pin contacts 110 is comprised of a terminal portion 111 and a compliant portion 112. Terminal portion 111 provides a flexible connection between compliant portion 112 and flat member 101.

Compliant portion 112 is shown most clearly in FIG. 3. Compliant portion 112 has a generally increasing cross-sectional thickness from endpoints 113 to a midpoint 114. This variation in cross-sectional thickness ranges from a minimum at endpoints 113 to a maximum at midpoint 114. Tapered regions 115 connect compliant portion 112 to terminal portion 111. Tapered regions 115 facilitate entry of pin contacts 110 into plated through holes in the circuit board.

Pin contacts 110 are fastened to flat member 101 by inserting them into apertures 106 and applying solder. Utilization of pin contacts 110 in this way provides a flexible mounting of connector 100 to the printed circuit board. Moreover, the use of compliant portion 112 facilitates the making of rapid connections.

Inserted into apertures 120 in the bottom of projection 102 are one or more studlike members 121. A longitudinal axis of studlike members 121 is parallel with longitudinal axes of pin contacts 110. Studlike members 121 absorb any shear stresses between connector 100 and the board which might be produced during connector use. These shear stresses are typically generated during the connection of the power lead to connector 100. Additional shear stresses are produced during normal connector use through the exertion of sidewardly directed forces. Downwardly directed forces are provided for by controlling the length of projection 102 beneath flat member 101.

While connector 100, as shown in FIG. 1, has three pin contacts 110 along each side, it should be noted that any number of pin contacts 110 might be employed along a side to achieve the desired result. For example, it may be desirable, where many connections of common power terminals are to be effected, to use more than three pin contacts 110 along a side. Correspondingly, some applications may require less than three pin contacts 110. Although one threaded aperture 106 is illustrated, as noted previously, additional threaded apertures 106 may be employed advantageously.

In all cases it is to be understood that the above described embodiment is illustrative of but a small number of many possible specific embodiments which can represent applications of the principles of the invention. Thus numerous and various other embodiments can be devised readily in accordance with three principles by those skilled in the art without departing from the spirit and scope of the invention.

I claim:

1. An electrical connector comprising:

a generally flat, unitary member of electrically conductive material having at least one aperture therein for terminating at least one electrical conductor;

means, affixed to said flat member in parallel rows, for electrically and mechanically coupling said member to a circuit board, each of said coupling means including a compliant portion at an intermediate point along its length for effecting frictional engagement between said coupling means and said circuit board, and a flexible terminal portion intermediate said compliant portion and said flat member, said flexible terminal portion having a length to a smallest cross-sectional width ratio greater than three and further having one end integral with said compliant portion and an opposite end affixed to said flat member, said flexible terminal portion providing a flexible connection between said compliant portion and said flat member; and means, affixed to said flat member at an intermediate point between said parallel rows of said coupling means, for counteracting shear stresses between said flat member and said circuit board upon the termination of said electrical conductor to said connector.

2. The electrical connector in accordance with claim 1 wherein said counteracting means comprises at least one studlike member fastened to and extending downwardly from said flat member, said studlike member having a longitudinal axis which is parallel with longitudinal axes of said coupling means.

3. The electrical connector in accordance with claim 2 wherein said compliant portion has a cross-sectional thickness which varies from a minimum thickness at endpoints to a maximum thickness at a midpoint.

4. The electrical connector in accordance with claim 3 wherein said compliant portion further includes tapered regions at points between said coupling means and said compliant portion, said tapered regions facilitating entry of said compliant portion into plated through holes in said circuit board.

5. The electrical connector in accordance with claim 4 further including means, integral with oppositely disposed edges of said flat member, for facilitating alignment between a terminated power lead and said connector.

6. The electrical connector in accordance with claim 5 wherein said facilitating means comprises a pair of raised lips.

7. An electrical connector comprising:

a generally flat, unitary member of electrically conductive material having at least one aperture therein for terminating at least one electrical conductor;

a plurality of pin contacts, affixed to said flat member in parallel rows, for electrically and mechanically coupling said flat member to a circuit board, each of said pin contacts including a compliant portion at an intermediate point along its length for effecting frictional engagement between said pin contacts and said circuit board, and a flexible terminal portion intermediate said compliant portion and said flat member, said flexible terminal portion having a length to a smallest cross-sectional width ratio greater than three and further having one end integral with said compliant portion and an opposite end affixed to said flat member, said flexible terminal portion providing a flexible connection between said compliant portion and said flat member; and at least one studlike member for counteracting shear stresses between said flat member and said circuit board upon the termination of said electrical conductor to said connector, said studlike member fastened to and extending downwardly from said flat member at an intermediate point between said parallel rows of said pin contacts and having a longitudinal axis which is parallel with longitudinal axes of said plurality of pin contacts.

8. The electrical connector in accordance with claim 7 wherein said compliant portion has a cross-sectional thickness which varies from a minimum thickness at endpoints to a maximum thickness at a midpoint.

9. The electrical connector in accordance with claim 8 wherein said compliant portion further includes tapered regions near oppositely disposed end portions to facilitate entry of said compliant portion into plated through holes in said circuit board.

10. The electrical connector in accordance with claim 9 further including means, integral with oppositely disposed edges of said flat member, for facilitating alignment between a terminated power lead and said connector.

11. The electrical connector in accordance with claim 10 wherein said facilitating means comprises a pair of raised lips.

* * * * *